United States Patent [19]

Cook

[11] 4,179,619

[45] Dec. 18, 1979

[54] OPTOCOUPLER HAVING INTERNAL REFLECTION AND IMPROVED ISOLATION CAPABILITIES

[75] Inventor: James S. Cook, Tully, N.Y.

[73] Assignee: General Electric Company, Auburn, N.Y.

[21] Appl. No.: 856,755

[22] Filed: Dec. 2, 1977

[51] Int. Cl.² .................................................. G02B 27/00
[52] U.S. Cl. ...................................... 250/551; 250/552; 250/239
[58] Field of Search ............... 250/551, 552, 239, 227, 250/211 J; 357/19

[56] References Cited

U.S. PATENT DOCUMENTS

| | | | |
|---|---|---|---|
| 3,818,451 | 6/1974 | Coleman | 250/551 |
| 3,976,877 | 8/1976 | Thillays | 250/551 |
| 4,095,116 | 6/1978 | Felkel | 250/551 |

Primary Examiner—M. Tokar
Attorney, Agent, or Firm—Robert J. Mooney; Stephen B. Salai

[57] ABSTRACT

The optocoupling between an optical source and an optical sensor is enhanced while retaining a high dielectric strength by providing a homogeneous medium surrounding the source and the sensor having an inner light transmissive region and an outer light reflective region encapsulated within a substantially opaque body. The homogeneous medium is formed by applying an optically transmissive material to the source and sensor and no more than partially curing said material before applying an optically reflective material which, when fully cured along with the optically transmissive material, does not form an isolation degrading boundary therebetween.

21 Claims, 4 Drawing Figures

OPTOCOUPLER HAVING INTERNAL REFLECTION AND IMPROVED ISOLATION CAPABILITIES

This invention relates in general to optocouplers and more particularly to isolating electrical optocouplers including internal optical reflection and high dielectric strength.

Optocouplers are becoming increasingly important in a wide variety of applications where it is desired to provide coupling between circuits operating at different electrical potentials. Optocouplers may typically employ a light emitting diode as a light or optical source and one or more of a number of light sensitive devices as an optical sensor. For example, light sensitive transistors, thyristors, triacs, and other similar semiconductor devices which may be triggered by light, or which have light sensitive gain characteristics, may be employed. While the terms—light sensitive, light source, light sensor, optical sensor, and similar terms—may be used herein, it is intended that these terms be understood to describe a broad range of devices including not only those utilizing visible light, but also infrared, ultraviolet, and other near visible radiation.

In many applications, it is desirable to employ a light sensitive element which is not characterized by an especially high light sensitivity. This type of optocoupler requires either that a light source of substantial light emitting capacity be employed, or where a more limited capacity light source is employed that essentially all of the light emanating therefrom be directed to, and impinge upon, the light sensitive element. A requirement that absorption of light within the optical coupler be minimized is imposed. It is oftentimes a further requirement of optical couplers that they be fabricated in accordance with methods adapted to minimize the cost thereof. This constraint on cost tends to limit somewhat the complexity of the optocoupler and the method for manufacturing it.

Various structures have been employed to enhance the coupling of light between optical sources and optical sensors in couplers of the type to which this invention is addressed. For example, optical couplers having clear light transmissive material within an encapsulating body of light reflective material, the optical source and sensor being located within the clear material, have been manufactured. Devices of this type, while useful in certain applications, are limited in the degree of isolation which can be obtained, and are sensitive to ambient light and, therefore useful only in non-critical applications, or in controlled light environments.

It is desirable and, therefore, an object of this invention to provide an optical coupler which achieves improved optical coupling between a light source and a light sensor.

It is another object of this invention to provide an optical coupler having improved optical coupling which exhibits at least the degree of isolation attainable in present couplers.

It is a further object of this invention to provide an optical coupler of the foregoing character which is insensitive to ambient lighting conditions and which may be operated in a wide variety of environments.

It is a still further object of this invention to provide an improved optical coupler of the foregoing character which may be readily manufactured in accordance with the techniques of present optocouplers.

It is a still further object of this invention to provide an improved optical coupler which may be manufactured at a cost competitive with existing couplers.

Briefly stated and in accordance with one aspect of this invention, an optical coupler is provide having an optical source and an optical sensor in physically spaced-apart, optically coupled relationship. A substantially homogeneous dielectric medium surrounding said source and said sensor is characterized by an inner light transmissive region including therein at least a portion of said source and said sensor, and an outer light reflective region surrounding said inner region. A substantially opaque, encapsulating body surrounds said dielectric medium.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

Figure 1:
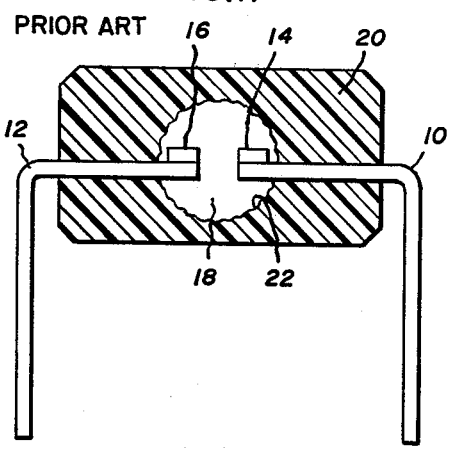
FIG. 1 is a section view of an optocoupler structure in accordance with the prior art.

Referring now to FIG. 1, there is illustrated a section view of an optocoupler in accordance with the prior art. First and second electrical leads 10 and 12 support and provide electrical connection to an optical source 14 and optical sensor 16. A light transmissive material 18 surrounds source 14 and sensor 16 and is in turn surrounded by encapsulating body 20. The external structure of the prior art device of FIG. 1 is oftentimes referred to as a Dual-In-Line Package, or DIP, owing to its two rows of colinear pins (not shown) exemplified by leads 10 and 12 of FIG. 1.

Encapsulating body 20 is opaque to light, typically black, and also light absorbtive. Further, it provides structural support for leads 10 and 12 as well as the remaining leads not illustrated. The package represented by FIG. 1 is of a type commonly used for integrated circuits and is, therefore, readily compatible therewith. While this invention may readily be practiced in conjunction with such a DIP package, it is not so limited and those skilled in the art will readily appreciate that a wide variety of packages may easily be employed. For example where a hermetically sealed package is required, an appropriate package as, for example, a TO-5 metal package may be employed.

Light transmissive material 18 and opaque encapsulating body 20 contact at interface 22. Interface 22 will be appreciated to be a surface intersecting each of leads 10 and 12. The degree of electrical isolation attainable in an optocoupler is to a great extent determined by the length and resistive character of interface 22. Two competing considerations are involved. A long path along interface 20 results in greater isolation, but is achieved at the expense of a large volume of optically transmissive material 18. The greater the volume of material 18, the higher the absorption of light. Absorption occurs both in the bulk of material 18, to a minor extent, and at interface 22 due to the absorptive character of encapsulating body 20. Thus, as can be seen, a trade-off between isolation and absorption has heretofore been required.

Figure 2:
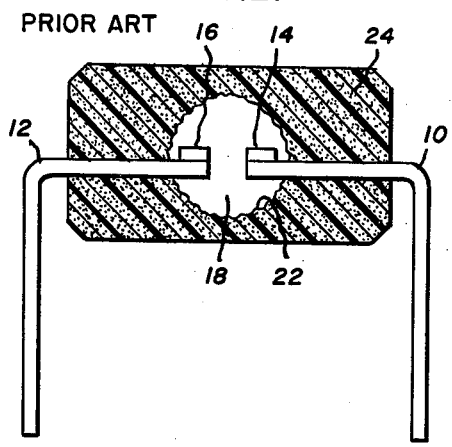
FIG. 2 is a section view of another optocoupler structure in accordance with the prior art.

The prior art device illustrated in FIG. 2 is an alternative to the device of FIG. 1, and in some applications, provides certain advantages. Leads 10 and 12, optical sources and sensors 14 and 16, and light transmissive regions 18 are like elements in the two figures, and are designated by like reference numerals as will be the consistent practice herein. Encapsulating body 24 of FIG. 2 is distinguished from body 20 of FIG. 1 in that body 24 is of light reflecting material. Body 24 may be made reflective by the inclusion therein of a particulate oxide of titanium rather than of a black pigment as was the case with body 20 of FIG. 1.

The device of FIG. 2, while superior to that of FIG. 1 in that more complete coupling of light from the source to the sensor is obtained, suffers from several disadvantages. It retains the disadvantage that electrical leakage along path 22 limits the ultimate electrical isolation attainable. Further, body 24 is not as opaque as body 20. When the coupler of FIG. 2 is utilized in an environment of high or varying ambient illumination either visible or of other character which affects sensor 16, inferior performance as is oftentimes evidenced by increased electrical leakage, results.

Still further, the oxides of titanium are known to detrimentally affect the apparatus conventionally used to mold body 24. The oxide of titanium is an abrasive, and decreased mold life is a result of its inclusion in the encapsulating material.

Figure 3:
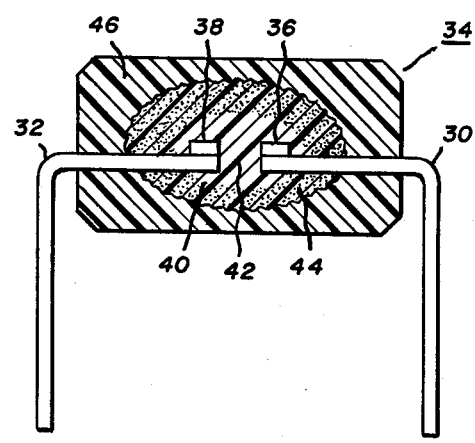
FIG. 3 is a section view of an optocoupler in accordance with a presently preferred embodiment of this invention.

Referring now to FIG. 3, there is illustrated in a section view an optical coupler constructed in accordance with a presently preferred embodiment of this invention. First and second leads 30 and 32 are provided, which leads comprise one opposing pair of a plurality of leads providing electrical connection to optical coupler 34. Optical coupler 34 may be conveniently fabricated in a DIP package having a number of pairs of pins (leads), for example, 3 pairs (6 pins) sufficient to provide all of the desired electrical connections to the components in the package. A light source 36 and a light sensitive element 38 are mounted in spaced apart relation on leads 30 and 32, respectively. In accordance with this invention, optical source 36 is any light, or near light, emitting source and is preferably a semiconductor light source, and more preferably a light emitting diode. While light emitting diodes are known having light outputs at a variety of visible and near visible wavelengths, an infrared emitting diode is preferred in accordance with the teachings of this invention.

It will be understood that although optical source 36 and optical sensor 38 are shown diagrammatically as blocks having only a single electrical connection thereto, in fact at least two electrical connections are required to each the source and the sensor and that appropriate connections, not illustrated, are provided to the non-illustrated pins of optocoupler 34. Connection may be made by any of those techniques known in the integrated circuit art as, for example, by thin wires bonded to the optical devices and to the appropriate pins of the package.

Optical sensor 38 may take an even wider variety of forms than optical source 36. For example, a useful device is provided wherein sensor 38 is a light sensitive transistor having electrical connection to the collector and emitter thereof and having an optically sensitive base region. Conveniently, connection may be made to the collector of such a light sensitive transistor by connecting the collector directly as, for example, by alloying or soldering, or by attaching with conductive epoxy to lead 32. This is convenient for those devices where the collector contact is physically located at the bottom of the device. The emitter is contacted as described hereinabove by a wire or beam lead or other conventional method and the base may be electrically contacted if desired by the same technique. It should be understood that while the invention presupposes an optical sensor having a base region responsive to light, it may be desirable to provide additional electrical contact to the base for applying a bias voltage, or the like. While an optically sensitive transistor in conjunction with an optical source provides an optocoupler of wide utility, it is within the scope of this invention to provide other optically sensitive devices. For example, an optically triggered thyristor may oftentimes be advantageously employed either as unidirectional thyristor or a bidirectional thyristor. Further, a triac may be employed where control of an AC load is required. Similarly, where control from an AC source is desired, two or more light emitting diodes may be utilized as, for example, in anti-parallel. The combinations of these and other elements to achieve particular structures for particular application may be varied widely while remaining within the scope of this invention.

In accordance with the present invention, optical source 36 and optical sensor 38 are contained within a common dielectric medium 40 which includes inner region 42 of high light transmissivity and outer region 44 of high light reflectivity. Region 44 is indicated by the stippled portion of medium 40 while region 42 is the unstippled region. While silicone is a presently preferred material, those skilled in the art will appreciate that other materials may equally well be employed so long as those properties which contribute to high dielectric strength, high light conductivity, ability to be rendered reflective by the addition of a suitable material thereto, as for example titanium oxide, ease of application in an uncured form followed by sufficiently slow rate of cure that the homogeneous region required by this invention may be formed. Dielectric medium 40 may conveniently be of a silicone rubber selected for high dielectric strength and good light transmission properties. Light reflective portion 44 of medium 40 is conveniently formed by the addition of an oxide of titanium, preferably $TiO_2$ to a clear silicone rubber material. In accordance with a presently preferred embodiment of this invention, inner light transmissive region 42 and outer light reflective region 44 are of the same dielectric material, outer region 44 being distinguished by the addition of $TiO_2$ thereto. Other materials may of course also be used if the foregoing requirements are met. It is a further characteristic of the material of which dielectric medium 40 is formed that clear region 42 may be applied to optical source 36 and sensor 38, and partially cured and then that reflective region 44 may be applied over clear region 42 without forming an interface therebetween. The combination dielectric medium 40 is then fully cured. While any of a number of materials as, for example, silicone rubber, epoxy, and the like, which exhibit the characteristic of being capable of forming a substantially homogeneous dielectric medium in two steps may be employed, it has been found that Dow Corning 6101 Silicone Rubber is especially useful. Reflective region 44 may be formed of the same material to which is added Titanium dioxide in the amount of 1-5 grams per ounce.

After dielectric medium 40 is fully cured, encapsulating body 46 is formed therearound. Body 46 is preferably a substantially rigid opaque material which provides both structural support for leads 30 and 32 and for the non-illustrated leads and which prevents ambient light from reaching light sensor 38. Advantageously, body 46 may be molded in a two-part mold process, that is, a process utilizing a two-part mold. While many materials possess the necessary rigidity and dielectric strength required of body 46, epoxy or silicone transfer molding compound are presently preferred.

The detailed steps required in manufacturing a rigid bodied DIP semiconductor component are generally known and will not be dealt with extensively herein. Basically, it will be appreciated that leads 30 and 32 may be part of a flat lead frame including a plurality of leads for each device and a plurality of sets of leads for the simultaneous manufacture of several devices. Typically, leads in a lead frame are joined together during most of the manufacturing process and separated, for example, by shearing and forming after the encapsulation of the device in body 46.

In accordance with one embodiment of this invention, the optical boundary between light transmissive region 42 and light reflective region 44, which interface defines a reflecting surface, is of elliptical shape, as for example, being or approximating an ellipsoid. In order to enhance the transfer of light from optical source 36 to optical sensor 38 to the greatest extent, these elements are placed at the opposing foci of the ellipsoid, or as close thereto as can be practically accomplished. It will be appreciated that ellipsoidal light transmissive region 42 may be formed by, for example, molding of the dielectric material in a removable mold which is adapted to constrain the lead frame therein for proper positioning of leads 30 and 32 so as to position optical sensor 38 and optical source 36 at the foci of the ellipsoid. While the achievement of precisely ellipsoidal shape for light transmissive region 42 is oftentimes desirable, it will be appreciated that some of the advantages of this invention are achieved by the mere combination of an arbitrarily shaped inner light transmissive region surrounded by an outer optically reflective region to ensure that a majority of the light generated by source 36 and transmitted within region 42 is reflected within region 42 until it is ultimately absorbed by sensor 38. The formation of region 42 by the unconstrained application to leads 30 and 32 of a drop of uncured, clear dielectric material may be preferred, since it is a low cost procedure, in many applications. Although an ellipsoidally shaped light transmissive region provides many advantages, those skilled in the art will appreciate that the configuration as, for example, parabolic or dual parabolically shaped, i.e., butted together, parabolic shaped light transmissive regions may be employed with good results.

The shape of the outer surface of reflecting region 40 is of far less importance that that of its inner surface. Accordingly, it is preferred to form outer light reflective region 40 by the simple application of uncured reflective dielectric material to the outside surface of light transmissive region 42. As has been hereinabove described, this application is performed before region 42 has fully cured in order to provide a homogeneous region having no boundary besides the optical boundary. The dielectric material is then cured and encapsulating body 46 is formed in a conventional manner.

Figure 4:
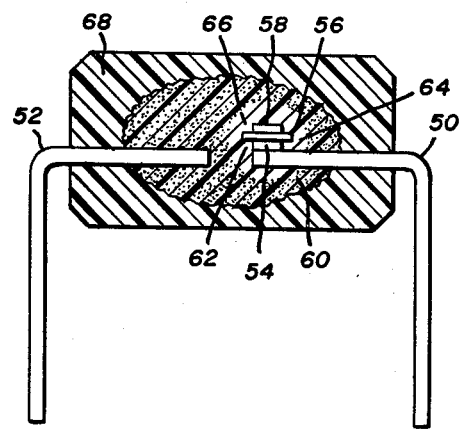
FIG. 4 is a section view of an optocoupler in accordance with an alternative embodiment of this invention.

The invention may be advantageously employed in conjunction with optocouplers of configurations differing from the spaced apart relationship of source and sensor illustrated at FIG. 3. For example, FIG. 4 illustrates an optical coupler having first and second leads 50 and 52, lead 50 having in sandwich-like relation thereon an optical sensor 54, a rigid dielectric member 56, and an optical source 58. Optical source 58 and optical sensor 54 are preferably of characteristics as have been described in connection with source 36 and sensor 38 of FIG. 3. Sensor 54 preferably is electrically and mechanically connected to lead 50 as for example by alloying or soldering or epoxying with conductive epoxy. It will be understood that at least one additional electrical connection (not illustrated) is made to sensor 54. Similarly, two connections are required to source 58. Substantially rigid dielectric member 56 is of light transmissive material, for example, glass, which exhibits high dielectric strength. Conveniently, member 56 may be provided with a conductive patterned layer thereon (not illustrated) for providing at least one connection to either or both of source 58 and sensor 54. Connection may be conveniently made from this pattern to additional leads of a lead frame (not illustrated) by thin wire leads.

Homogeneous dielectric medium 60 surrounds the elements heretofore described. Medium 60 includes an inner light transmissive region 62 which immediately surrounds sensor 54, dielectric 56, and source 58 along with a portion of lead 50. A portion of lead 52 may also be included without serious degradation of performance. It should be recalled, however, that, insofar as possible, a small light reflective boundary is preferred over a large one. Outer light reflective region 64 surrounds region 62 and forms optical interface 66 therebetween for providing a reflective surface boundary around light transmissive region 62. An opaque encapsulating body 68 encloses the foregoing elements for providing mechanical support for leads 50 and 52, and for isolating sensor 54 from the effects of ambient light. The formation of dielectric medium 60 is as has been described for medium 40. Inner region 62 is formed first and allowed to no more than partially cure. Outer region 64 is then formed therearound and the entire medium is cured simultaneously. In this way, an isolation degrading interface is not formed between the light transmissive and light reflective regions of dielectric medium 60.

While it was advantageous to provide an ellipsoidal light transmissive region 42 in the spaced apart optocoupler arrangement of FIG. 3, no particular advantage attached to such a configuration in the device of FIG. 4. Accordingly, region 62 is preferably a generally round region as is advantageously formed by the unconstrained application of a drop of uncured dielectric material to the layered combination of sensor 54, dielectric 56, and source 58. The material of region 62 may conveniently be applied with a dropper or syringe. After no more than partially curing region 62, region 64 is similarly formed.

In accordance with an exemplary process for practicing this invention, a clear silicone rubber dielectric is applied to the device as hereinabove described and cured at between 60° and 100° C. and more preferably at 75° C.±5° C. for one to one and one-half hours. A reflective silicone rubber dielectric including $TiO_2$ is then applied. The two materials mix at the interface. The dielectric is then cured at about 150° C.±5° C. for three to four hours. The formation of a rigid epoxy as silicone encapsulating body proceeds is well known in the art.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. An optoelectric device comprising:
    an optical source;
    an optical sensor spaced apart from said optical source; and
    means for providing enhanced transmission of radiation between said source and said sensor including an essentially homogeneous body of solid dielectric medium having an inner light transmissive region, optically coupling said optical source and said optical sensor, and an outer light reflective region essentially surrounding said inner light transmissive region, said inner and outer regions being simultaneously cured to eliminate an interface therebetween.

2. The device of claim 1 wherein said optical source comprises a semiconductor light emitting diode.

3. The device of claim 2 wherein said light emitting diode comprises an infrared emitting diode.

4. The device of claim 3 wherein said dielectric medium comprises a silicone medium.

5. The device of claim 3 wherein said dielectric medium comprises an epoxy medium.

6. The device of claim 4 wherein said light transmissive region comprises a clear silicone region and said light reflective region comprises a reflective silicone region.

7. The device of claim 6 wherein said reflective silicone region comprises a titanium oxide bearing silicone region.

8. The device of claim 1 further comprising substantially rigid, optically transmissive dielectric means for supporting said optical source and said optical sensor in an electrically-isolated, spaced-apart, optically-coupled relationship.

9. The device of claim 8 wherein said substantially rigid, optically-transmissive, dielectric means comprises a glass dielectric.

10. The device of claim 1 further comprising:
    a plurality of spaced-apart, electrically-isolated, metal leads arranged in opposing pairs comprising first and second rows, said optical source mounted to a first lead in one of said opposing pairs and said optical sensor mounted to a second lead in the same opposing pair.

11. The device of claim 10 wherein said light transmissive region contains at least a portion of said first and said second leads.

12. The device of claim 11 further comprising a substantially rigid encapsulating body surrounding said dielectric medium.

13. The device of claim 12 wherein said encapsulating body is substantially optically opaque.

14. The device of claim 12 wherein said encapsulating body is formed of a material different from said dielectric medium.

15. The device of claim 1 wherein said light transmissive region comprises clear silicone rubber.

16. The device of claim 15 wherein said light reflective region comprises silicone rubber containing titanium oxide therein.

17. The device of claim 1 wherein said light transmissive region is a generally ellipsoidally shaped region.

18. The device of claim 1 wherein said light transmissive region is at least partially parabolic.

19. A method for forming an optically coupled electrical device comprising:
    providing an optical source;
    providing an optical sensor;
    mounting said optical sensor in spaced-apart relation with said optical source to be responsive to light from said optical source;
    at least partially filling the space between said optical source and said optical sensor with a curable light transmissive medium;
    surrounding said optical source, said optical sensor and said light transmissive medium, with a curable light reflective medium;
    simultaneously curing said light transmissive medium and said light reflective medium; and
    surrounding said cured medium with a substantially opaque encapsulating body.

20. The method of claim 19 further comprising partially curing said light transmissive medium before said surrounding with said light reflective medium.

21. The method of claim 19 wherein said mounting said optical sensor in spaced-apart relation with said optical source comprises providing a substantially rigid, light transmissive member and mounting said optical source and said sensor on opposite sides of said light transmissive member.

* * * * *